United States Patent
Choi et al.

(10) Patent No.: US 11,417,546 B2
(45) Date of Patent: Aug. 16, 2022

(54) METHOD AND APPARATUS FOR TRANSFERRING MICRO DEVICE, AND ELECTRONIC PRODUCT USING THE SAME

(71) Applicant: KOREA INSTITUTE OF MACHINERY & MATERIALS, Daejeon (KR)

(72) Inventors: Byung-Ik Choi, Daejeon (KR); Yun Hwangbo, Daejeon (KR); Jae-Hyun Kim, Daejeon (KR); Sung Uk Yoon, Daejeon (KR); Chang Hyun Kim, Daejeon (KR); Jung Yup Kim, Daejeon (KR); Kyung-Sik Kim, Daejeon (KR); Sang Min Kim, Daejeon (KR); Bongkyun Jang, Daejeon (KR); Kwangseop Kim, Daejeon (KR)

(73) Assignee: KOREA INSTITUTE OF MACHINERY & MATERIALS, Daejeon (KR)

( * ) Notice: Subject to any disclaimer, the term of this patent is extended or adjusted under 35 U.S.C. 154(b) by 0 days.

(21) Appl. No.: 17/045,541

(22) PCT Filed: Apr. 16, 2019

(86) PCT No.: PCT/KR2019/004568
§ 371 (c)(1),
(2) Date: Oct. 6, 2020

(87) PCT Pub. No.: WO2019/203531
PCT Pub. Date: Oct. 24, 2019

(65) Prior Publication Data
US 2021/0166959 A1    Jun. 3, 2021

(30) Foreign Application Priority Data
Apr. 16, 2018 (KR) .................. 10-2018-0044104

(51) Int. Cl.
*H01L 21/67* (2006.01)
*B32B 38/10* (2006.01)
*H01L 25/075* (2006.01)

(52) U.S. Cl.
CPC ........ *H01L 21/67132* (2013.01); *B32B 38/10* (2013.01); *H01L 25/0753* (2013.01);
(Continued)

(58) Field of Classification Search
CPC . H01L 2221/68318; H01L 2221/68386; H01L 2221/68395; H01L 2221/68354;
(Continued)

(56) References Cited

U.S. PATENT DOCUMENTS 8,171,977 B2* 5/2012 Kobayashi ........ H01L 21/67132
156/760
9,673,170 B2* 6/2017 Fischer ................... H01L 24/83
(Continued)

FOREIGN PATENT DOCUMENTS

JP     08-314294     11/1996
JP     2003-017549   1/2003
(Continued)

*Primary Examiner* — George R Koch
(74) *Attorney, Agent, or Firm* — Lex IP Meister, PLLC

(57) ABSTRACT

An exemplary embodiment of the present invention provides a method of transferring a micro device. The method of transferring the micro device includes: separating a transferring film from a micro device transferred to a target substrate and bending the transferring film upwardly to form a bent circular arc, and pressurizing an upper transferring film fed after the bent circular arc is formed by a pressurizing roller rotating at an upper side of the target substrate.

14 Claims, 10 Drawing Sheets

(52) U.S. Cl.
CPC ............... *H01L 2221/68318* (2013.01); *H01L 2221/68354* (2013.01); *H01L 2221/68386* (2013.01); *Y10S 156/93* (2013.01); *Y10S 156/941* (2013.01); *Y10T 156/1174* (2015.01); *Y10T 156/195* (2015.01); *Y10T 156/1978* (2015.01)

(58) Field of Classification Search
CPC . B32B 38/10; B32B 43/006; Y10T 156/1174; Y10T 156/195; Y10T 156/1978; Y10S 156/93; Y10S 156/941
See application file for complete search history.

(56) References Cited

U.S. PATENT DOCUMENTS

2007/0235131 A1* 10/2007 Tsujimoto .......... B29C 63/0013
156/714
2008/0302480 A1* 12/2008 Berger .............. H01L 21/67132
156/714

FOREIGN PATENT DOCUMENTS

| JP | 2004-312666 | 11/2004 |
|----|-------------|---------|
| KR | 10-1738304 | 5/2017 |
| KR | 10-1800367 | 11/2017 |
| TW | 201535558 | 9/2015 |
| TW | 201604995 | 2/2016 |

* cited by examiner

METHOD AND APPARATUS FOR TRANSFERRING MICRO DEVICE, AND ELECTRONIC PRODUCT USING THE SAME

This application is a 371 of PCT/KR2019/004568, filing date Apr. 16, 2019.

TECHNICAL FIELD

The present invention relates to a method and an apparatus for transferring a micro device, and an electronic product using the same, and more particularly, to a method and an apparatus for transferring a micro device, which are applicable to more various micro devices and are capable of improving transferring efficiency, and an electronic product including a micro device transferred by using the transferring method.

BACKGROUND ART

A display using a micro LED device is attracting attention as a next-generation advanced display to replace an existing display. In order to manufacture the display, a technology of transferring micro LED devices to a circuit board is core.

Large and thick elements may be transferred by other methods, such as a vacuum chuck, but a method of transferring a small and thin element having a micro/nano size is limited. A micro device having several tens of μm or less may be damaged due to pressure generated in a vacuum chuck, so that it is difficult to use a vacuum chuck. As another method, there is a method of transferring a device by using an electrostatic chuck technology, but when the method is applied to a thin device, the device may be damaged by static electricity and may be influenced by surface pollutant of the device to degrade transferring performance.

Because of the reasons stated above, for a device having a thin film form having a very small thickness, a technology of transferring a device by using adhesive force is widely used.

In general, the method of transferring a micro device by using adhesive force bonds a micro device array arranged on a source substrate to a transferring film and transfers a micro device to a solder applied onto an electrode of a target substrate.

The transferring method may be generally divided into a method using a roller and a method using a pressurizing plate according to a scheme of pressurizing a micro device to a target substrate. The transferring method using a roller has an advantage in improving productivity of a mass production process.

FIG. 1 is a diagram illustrating an example of a method of transferring a micro device by using a roller in the related art.

As illustrated in FIG. 1, a transfer film 10 is directly pressurized by a pressurizing roller 20, and thus, pressure is applied to a micro device 30 bonded to the transfer film 10, so that the micro device 30 is transferred to a target substrate 40.

In the method, there is difficulty in precisely controlling the pressure applied to the target substrate 40 by the pressurizing roller 20. That is, when the pressure of the pressurizing roller 20 is excessively small, the transfer may not be performed, and when the pressure of the pressurizing roller 20 is excessively large, a contact area between the pressurizing roller 20 and the target substrate 40 is increased to degrade transferring efficiency and damage the micro device 30.

When a size of the micro device is small, it is more difficult to accurately control the pressure of the pressurizing roller 20. In order to control the contact area between the pressurizing roller 20 and the target substrate 40 to be appropriate to a size of the device, a diameter of the pressurizing roller 20 needs to be small, but there is a limitation in decreasing a diameter of the pressurizing roller 20. When a size of the micro device is small and an interval between the micro devices bonded to the source substrate is simultaneously decreased, it become more difficult to accurately control the pressure of the pressurizing roller 20.

The phenomenon is a problem generating in a method of pressurizing a micro device by using a pressurizing plate.

Further, in order to efficiently transfer a further miniaturized micro device, a new technology is required.

DISCLOSURE

Technical Problem

The present invention has been made in an effort to provide a method of transferring a micro device, which is applicable to more various micro devices and is capable of improving transferring efficiency.

The present invention has also been made in an effort to provide an apparatus for transferring a micro device, which is applicable to more various micro devices and is capable of improving transferring efficiency.

The present invention has also been made in an effort to provide an electronic product including a micro device transferred by using the transferring method.

The technical object aimed to be achieved by the present invention is not limited to the foregoing technical object, and other non-mentioned technical objects may be clearly understood by those skilled in the art from the description below.

Technical Solution

An exemplary embodiment of the present invention provides a method of transferring a micro device, the method including: feeding a target substrate in a first direction at a first speed; supplying a transferring film bonded with a micro device in the first direction, the micro device facing an upper portion of the target substrate; pressurizing the transferring film, the pressurizing including bending the transferring film separated from the micro device upwardly to form a bent circular arc, and pressurizing an upper transferring film fed after forming the bent circular arc with a pressuring roller rotating at an upper side of the target substrate to deliver pressure to a lower transferring film bonded with the micro device; and collecting the upper transferring film by feeding the upper transferring film fed after forming the bent circular arc at a second speed along a second direction opposite to the first direction, wherein a first center of the bent circular arc is in a front side of a second center of the pressurizing roller based on the first direction.

In the exemplary embodiment of the present invention, a spaced distance between an upper surface of the micro device transferred to the target substrate and a lower end portion of the pressurizing roller may exceed twice a thickness of the transferring film.

In the exemplary embodiment of the present invention, a linear velocity, the second speed, and the first speed of the pressurizing roller may be the same.

In the exemplary embodiment of the present invention, the method may further include first controlling for adjusting a radius of curvature of the bent circular arc by adjusting a linear velocity of the pressurizing roller for a predetermined time.

In the exemplary embodiment of the present invention, the first controlling may include: first curvature radius adjusting in which a radius of curvature of the bent circular arc is controlled to be decreased by shifting a location of the first center of the bent circular arc to a rear side based on the first direction by increasing the linear velocity of the pressurizing roller, or a radius of curvature of the bent circular arc is controlled to be increased by shifting a location of the first center of the bent circular arc to a front side based on the first direction by decreasing the linear velocity of the pressurizing roller.

In the exemplary embodiment of the present invention, the first controlling may further include first speed adjusting in which the first speed and the second speed are controlled to be the same as the linear velocity of the pressurizing roller adjusted in the first curvature radius adjusting after the first curvature radius adjusting.

In the exemplary embodiment of the present invention, the method may further include second controlling for adjusting a radius of curvature of the bent circular arc by adjusting the first speed of the target substrate for a predetermined time.

In the exemplary embodiment of the present invention, the second controlling may include: second curvature radius adjusting in which the radius of curvature of the bent circular arc is controlled to be increased by shifting a location of the first center of the bent circular arc to a front side based on the first direction by increasing the first speed of the target substrate, or the radius of curvature of the bent circular arc is controlled to be decreased by shifting a location of the first center of the bent circular arc to a rear side based on the first direction by decreasing the first speed of the target substrate.

In the exemplary embodiment of the present invention, the second controlling may further include second speed adjusting in which the linear velocity of the pressurizing roller and the second speed are controlled to be equal to the first speed of the target substrate adjusted in the second curvature radius adjusting after the second curvature radius adjusting.

In the exemplary embodiment of the present invention, the pressurizing may include delivering additional pressure to the lower transferring film through a pressurizing rod disposed inside the bent circular arc formed by the transferring film.

In the exemplary embodiment of the present invention, in the pressurizing, when the pressurizing roller pressurizes the upper transferring film, the upper transferring film may be in contact with the lower transferring film.

Another exemplary embodiment of the present invention provides an apparatus for transferring a micro device, the apparatus including: a supplying roller configured to supply a transferring film bonded with a micro device in a first direction; a target substrate, to which the micro device is transferred from the supplied transferring film, while being fed in the first direction; a pressurizing roller disposed in an upper portion of the target substrate and configured to pressurize the transferring film from which the micro device is separated; and a collecting roller configured to collect the transferring film, in which the transferring film which transfers the micro device to the target substrate is shifted in a second direction that is an opposite direction of the first direction while being bent upwardly and forming a bent circular arc, and a center of the pressurizing roller is arranged at a rear side of a center of the bent circular arc, and the pressurizing roller pressurizes the transferring film shifted in the second direction in a lower direction while forming the bent circular arc.

In the exemplary embodiment of the present invention, the apparatus may further include a pressurizing rod disposed inside the bent circular arc formed by the transferring film.

In the exemplary embodiment of the present invention, the transferring film may include: a base layer having rigidity; and an adhesive layer provided on one surface of the base layer to provide adhesive force to the micro device, and the adhesive layer from which the micro device is separated may be in contact with the pressurizing roller to provide frictional force.

In the exemplary embodiment of the present invention, the transferring film may further include a lubricating layer provided on the other surface of the base layer so that the transferring films before and after the bent circular arc is formed are in contact with each other and are shifted.

Still another exemplary embodiment of the present invention provides an electronic product including a micro device transferred by using the method of transferring the micro device.

Advantageous Effect

According to the exemplary embodiment of the present invention, the pressurizing roller pressurizes a transferring film, that is, an upper transferring film, to which a micro device is not bonded. Then, pressure is delivered to a transferring film, that is, a lower transferring film, to which the micro device is bonded, by rigidity of the bent transferring film, and the micro device is pressurized to the target substrate by the pressure. Then, the pressure may be easily controlled during the progress of the transferring process by adjusting a radius of curvature of the bent circular arc of the film. Further, rigidity of the transferring film may be changed according to a property, a thickness, and a shape, such as a multi-layer structure, of a material of the film, and may be selected so as to be suitable for the process. Accordingly, it is possible to accurately control pressure, which is difficult to be implemented in the case where the pressurizing roller directly pressurizes the transferring film to which the micro device is bonded in the related art, and buffer pressure by flexibility of the transferring film. Accordingly, it is possible to improve transferring efficiency and effectively prevent the micro device from being damaged due to pressure.

Further, according to the exemplary embodiment of the present invention, when a size of a micro device bonded to the transferring film and an interval between the micro devices are changed, it is possible to precisely adjust pressure that is to be provided to the micro device by adjusting a linear velocity of the pressurizing roller or adjusting a feeding speed of the target substrate.

The effects of the present invention are not limited to the foregoing effects, and it shall be understood that the effect of the present invention includes all of the effects inferable from the detailed description of the present invention or the configuration of the invention described in the claims.

MODE FOR INVENTION

Figure 1:
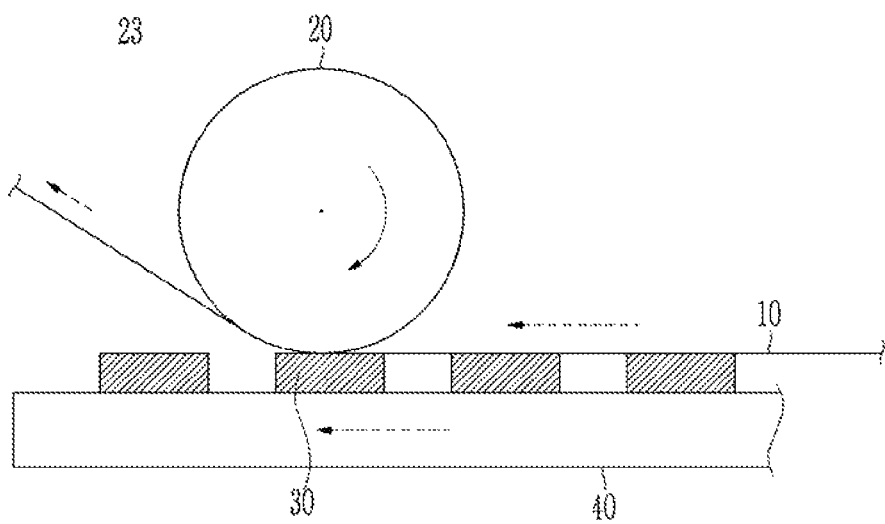
FIG. 1 is a diagram illustrating an example of a method of transferring a micro device by using a roller in the related art.

Hereinafter, the present invention will be described with reference to the accompanying drawings. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout the specification, when it is described that a part is "connected (in contact with, coupled)" to the other part, the part may be "directly connected" to the other element or "connected" to the other part through a third part. Unless explicitly described to the contrary, the word "comprise" and variations such as "comprises" or "comprising" will be understood to imply the inclusion of stated elements but not the exclusion of any other elements.

Further, terms used in the present specification are used for simply explaining a specific exemplary embodiment, and are not used for intending to limit the present invention. A singular expression includes a plural expression unless it is specifically described to the contrary in the context. In the present specification, it will be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance.

Hereinafter, exemplary embodiments of the present invention will be described in detail with reference to the accompanying drawings.

Figure 2:
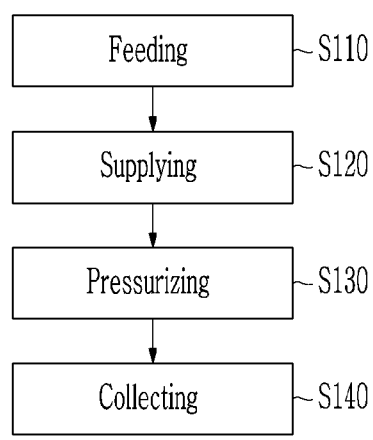
FIG. 2 is a flowchart illustrating a method of transferring a micro device according to a first exemplary embodiment of the present invention.
Figure 3:
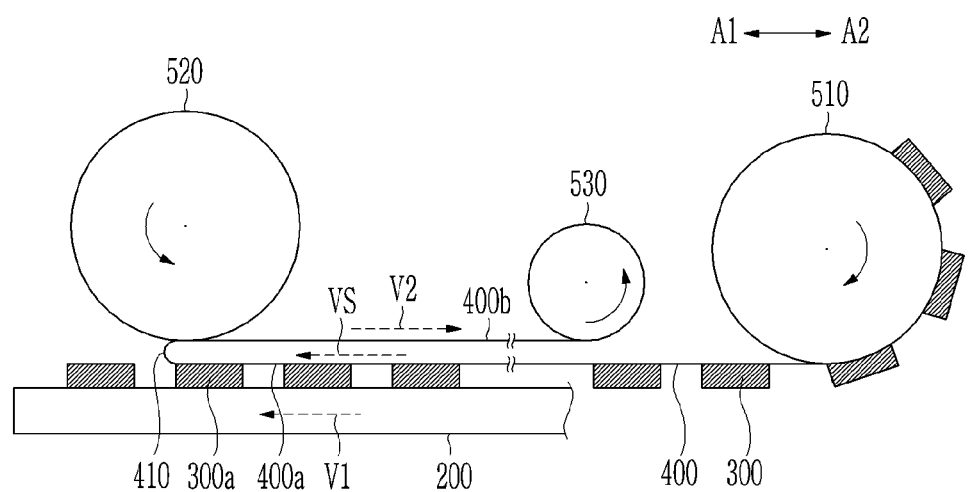
FIG. 3 is a diagram illustrating an example of a transferring process according to the method of transferring the micro device according to the first exemplary embodiment of the present invention.

FIG. 2 is a flowchart illustrating a method of transferring a micro device according to a first exemplary embodiment of the present invention, and FIG. 3 is a diagram illustrating an example of a transferring process according to the method of transferring the micro device according to the first exemplary embodiment of the present invention.

As illustrated in FIGS. 2 and 3, the method of transferring the micro device may include feeding S110, supplying S120, pressurizing S130, and collecting S140.

The feeding S110 may be a step for feeding a target substrate 200 in a first direction A1 at a first speed V1.

The target substrate 200 may be the substrate to which the micro device 300 is to be transferred. A first electrode 210 (see FIG. 4) may be provided on the target substrate 200, and a solder 220 (see FIG. 4) may be prepared on an upper surface of the first electrode 210.

The target substrate 200 may be the solid substrate or the flexible substrate.

The supplying S120 may be a step for disposing the micro device 300 bonded to a transfer film 400 to face the upper portion of the target substrate 200 and supplying the transferring film 400 in the first direction A1.

The micro devices 300 may be in the state of being bonded to a lower surface of the transferring film 400 at a predetermined interval. The transferring film 400 to which the micro devices 300 are bonded may be prepared in the state of being wound around a supplying roller 510.

To this end, a process of shifting the micro device of a source substrate (not illustrated) to the transferring film 400 needs to be preceded.

The transferring film 400 wound around the supplying roller 510 may be supplied in the first direction A1 in which the target substrate 200 is fed, and in this case, the micro device 300 may be disposed to face the upper portion of the target substrate 200. A second electrode 310 (see FIG. 4) may be provided on a lower portion of the micro device 300.

In the supplying S120, the second electrode 310 of the micro device 300 to be transferred to the target substrate 200 may be in the state of being provisionally bonded to the solder 220 of the first electrode 210 of the target substrate 200. Accordingly, a supply speed VS of the transferring film 400 supplied in the first direction A1 may be the same as the first speed V1 that is the feeding speed of the target substrate 200.

The pressurizing S130 may be a step, in which the transferring film 400 is separated from a micro device 300a transferred to the target substrate 200 and then is bent toward the upper side to form a bent circular arc 410, and an upper transferring film 400b fed after the forming of the bent circular arc 410 is pressurized by the pressurizing roller 520 that rotates at the upper side of the target substrate 200 and pressure is delivered to the lower transferring film 400a which is bonded with the micro device 300 and supplied.

That is, the transferring film 400 may include the lower transferring film 400a supplied in the first direction A1 in the state of being bonded with the micro device 300, and the upper transferring film 400b which is bent toward the upper side to form the bent circular arc 410 and then is fed in a second direction A2.

In the pressurizing S130, when the upper transferring film 400b is pressurized in the down direction by the pressurizing roller 520, pressure may be delivered to the lower transferring film 400a by rigidity of the transferring film 400. Then, the pressure is also delivered to the micro device 300a by the lower transferring film 400a, so that the micro device 300a may be pressurized to the target substrate 200.

The collecting S140 may be a step, in which the upper transferring film 400b fed after the forming of the bent circular arc 410 is fed in the second direction A2 that is an opposite direction of the first direction A1 at a second speed V2 and is collected.

The feeding S110, the supplying S120, the pressurizing S130, and the collecting S140 are not sequentially performed, but may be simultaneously performed. Further, a linear velocity, the second speed V2, and the first speed V1 of the pressurizing roller 520 in a stable state may have the same size. Herein, the linear velocity may be a linear velocity of a surface by the rotation of the pressurizing roller 520. Accordingly, the supply and the collection of the transferring film 400 may be continuously performed while continuously forming the bent circular arc 410 having the same radius of curvature at the same position, and the micro device 300 may also be continuously transferred.

The size of the radius of curvature of the bent circular arc 410 may be adjusted according to a size of the transferred micro device. That is, when the size of the transferred micro device is small, the size of the radius of curvature of the bent circular arc 410 may be small, and when the size of the transferred micro device is large, the size of the radius of curvature of the bent circular arc 410 may be large. Accordingly, it is possible to accurately deliver pressure even to a micro device having a small size.

In the meantime, a setting operation for performing the micro device transferring process will be described below.

In the setting operation, when an operator holds one end portion of the transferring film 400 wound around the supplying roller 510 and pulls the transferring film 400 in the first direction A1, the transferring film 400 may be supplied in the first direction A1. Then, the bent circular arc 410 may be formed by bending the transferring film 400 toward the upper side at a point at which the transferring film 400 passes the pressurizing roller 520 based on the first direction A1, and then the transferring film 400 may be connected to a collecting roller 530 by pulling the transferring film 400 in the second direction A2 that is the opposite direction of the first direction A1.

The supplying roller 510 may be provided to freely rotate based on a center axis, and the collecting roller 530 may receive power and rotate so that the transferring film 400 is wound.

Accordingly, when the target substrate 200 is fed in the first direction A1 at the first speed V1 and the collecting roller 530 rotates, the lower transferring film 400a is fed in the first direction A1 based on the bent circular arc 410 and the upper transferring film 400b is fed in the second direction A2 to be collected.

Then, the second speed V2 is adjusted to have the same size as that of the first speed V1 by adjusting a linear velocity of the collecting roller 530 and the linear velocity of the pressurizing roller 520 is adjusted to have the same size as that of the second speed V2, so that the feeding of the target substrate 200 and the transferring film 400 and the rotation of the pressurizing roller 520 may be maintained in the stable state. Further, when the feeding of the target substrate 200 and the transferring film 400 and the rotation of the pressurizing roller 520 are maintained in the stable state, the micro device 300 may be continuously transferred.

Figure 4:
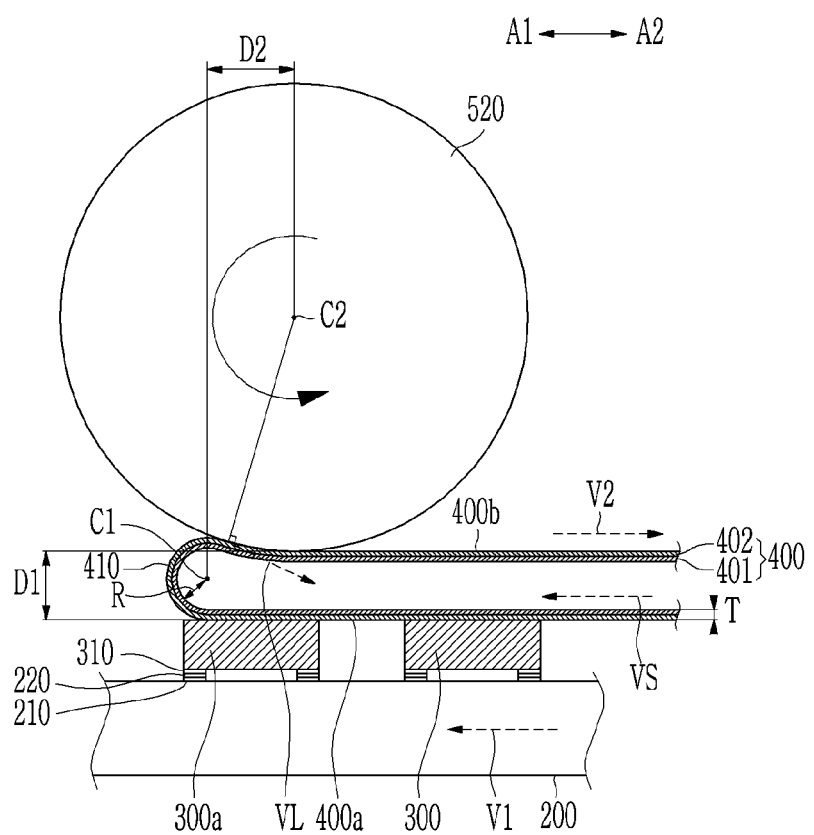
FIG. 4 is a diagram illustrating an example of an enlarged principal part of the transferring process according to the method of transferring the micro device according to the first exemplary embodiment of the present invention.

FIG. 4 is a diagram illustrating an example of an enlarged principal part of the transferring process according to the method of transferring the micro device according to the first exemplary embodiment of the present invention.

Hereinafter, for convenience of the description, a front direction and a rear direction will be described based on the first direction A1 that is the feeding direction of the target substrate 200. That is, when the target substrate 200 is shifted from a first point to a second point, the first point is a rear direction and the second point is a front direction.

As illustrated in FIG. 4, a spaced distance D1 between the upper surface of the micro device 300a transferred to the target substrate 200 and the lower end portion of the pressurizing roller 520 may exceed twice a thickness T of the transferring film 400.

Then, based on the first direction A1, a first center C1 of the bent circular arc 410 may be formed in front of a second center C2 of the pressurizing roller 520.

A radius R of curvature of the bent circular arc 410 may be adjusted by adjusting a control distance D2 between the first center C1 and the second center C2. That is, when the position of the first center C1 of the bent circular arc 410 is shifted in the rear direction based on the first direction A1, the radius R of curvature of the bent circular arc 410 may be decreased. Then, when the position of the first center C1 of the bent circular arc 410 is shifted in the front direction based on the first direction A1, the radius R of curvature of the bent circular arc 410 may be increased.

The second speed V2 when the transferring film 400 is fed so as to be collected may have the same size as that of the first speed V1 that is the feeding speed of the target substrate 200. Accordingly, a supply speed VS at which the transferring film 400 is supplied in the first direction A1 in which the target substrate 200 is fed may have the same size as that of the first speed V1 that is the feeding speed of the target substrate 200.

Further, the linear velocity VL of the pressurizing roller 520 may be the same as the second speed V2 that is the speed at which the transferring film 400 is collected. Accordingly, in the stable state where pressure appropriate to transfer the corresponding micro device 300 to the target substrate 200 is providable, the transferring film 400 may be fed so that the bent circular arc 410 having the predetermined radius R of curvature is formed to supply uniform pressure, and the micro device 300a may be stably transferred.

The transferring film 400 may have a base layer 401 and an adhesive layer 402.

The base layer 401 may provide the lower transferring film 400a with rigidity so that pressure is generated in the down direction when the upper transferring film 400b is pressurized by the pressurizing roller 520. That is, the base layer 410 may have resistive force or form restoring force against the transformation, so that it is possible to control a size of pressure generated in the down direction of the lower transferring film 400a according to a property of a material of the base layer 410.

Further, the adhesive layer 402 may provide adhesive force so that the micro devices 300 and 300a are bonded. The adhesive layer 402 may be in close contact with the pressurizing roller 520 when the transferring film 400 is bent upwardly to form the bent circular arc 410 and then is fed in the second direction A2. Slip is not generated between the pressurizing roller 520 and the adhesive layer 402 by adhesive force of the adhesive layer 402, and thus, the size of the linear velocity VL of the pressurizing roller 520 may be the same as the size of the second speed V2 of the upper transferring film 400b. Further, the second speed V2 of the upper transferring film 400b may be adjusted by adjusting the linear velocity of the pressurizing roller 520 which will be described below.

In the method of transferring the micro device in the related art, the pressurizing roller 20 directly pressurizes the transferring film 10 to which the micro device 30 is bonded to allow the micro device 30 to be transferred to the target substrate 40 (see FIG. 1).

However, according to the present invention, the pressurizing roller 520 pressurizes the transferring film, that is, the upper transferring film 400b, to which the micro device 300 is not bonded. Then, the pressure is delivered to the transferring film, that is, the lower transferring film 400a, to which the micro device 300 is bonded, by the rigidity of the bent transferring film, and the micro device 300a may be pressurized and transferred to the target substrate 200 by the pressure.

Accordingly, as described above, the present invention may accurately control pressure and buffer pressure, which is difficult to be implemented in the case where the pressurizing roller directly pressurizes the transferring film to which the micro device is bonded in the related art, and thus, it is possible to improve transferring efficiency and effectively prevent the micro device 300 from being damaged due to pressure.

In addition, the pressurizing roller 520 may also be controlled so that a vertical location is varied. Further, an adhesive layer (not illustrated) may be further coated on an outer peripheral surface of the pressurizing roller 520 in order to further improve adhesiveness with the adhesive layer 402 of the transferring film 400.

Figure 5:
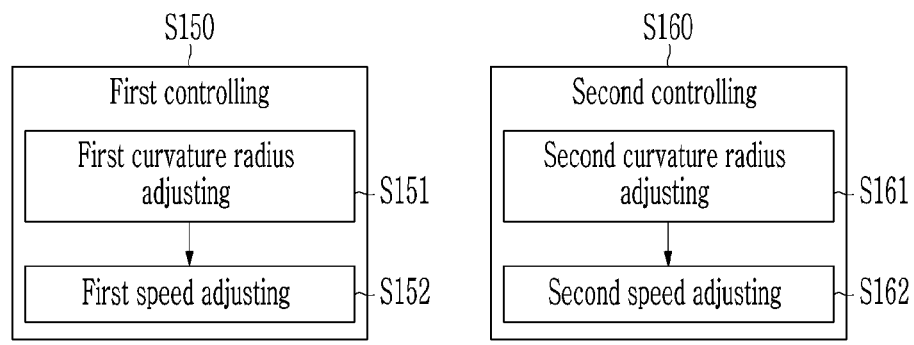
FIG. 5 is a flowchart illustrating controlling in the method of transferring the micro device according to the first exemplary embodiment of the present invention.
Figure 6:
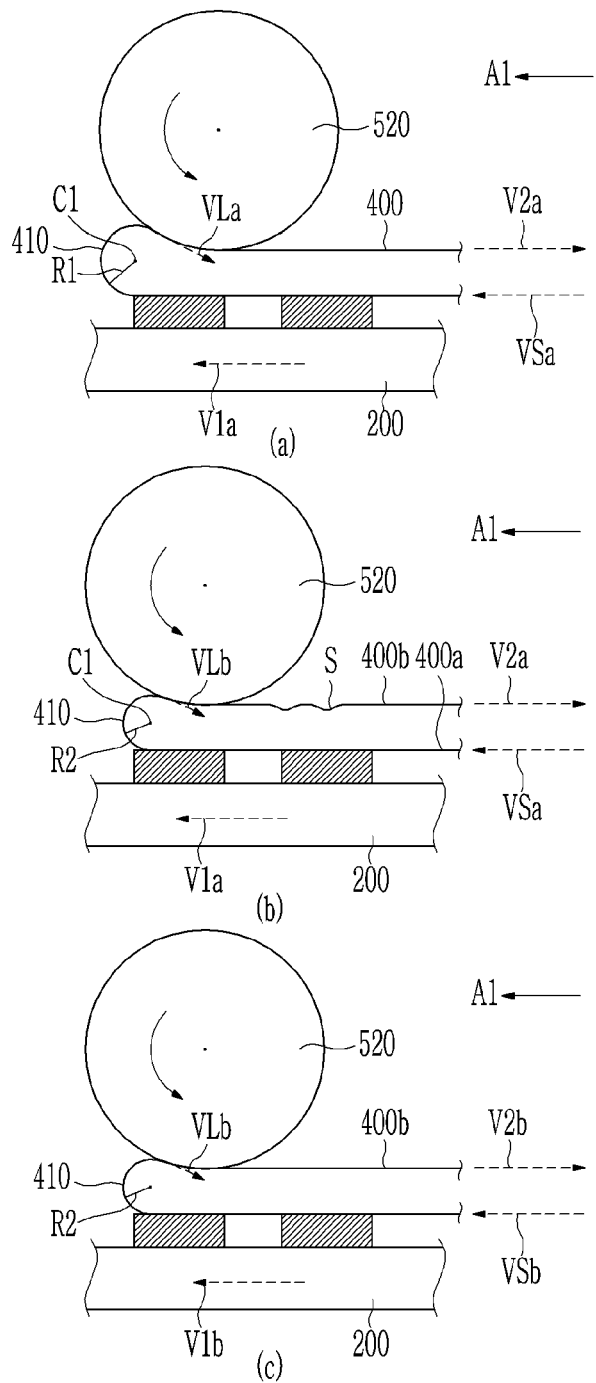
FIGS. 6a, 6b, 6c, 7a, 7b, and 7c are diagrams illustrating an example for describing the controlling in the method of transferring the micro device according to the first exemplary embodiment of the present invention.
Figure 7:
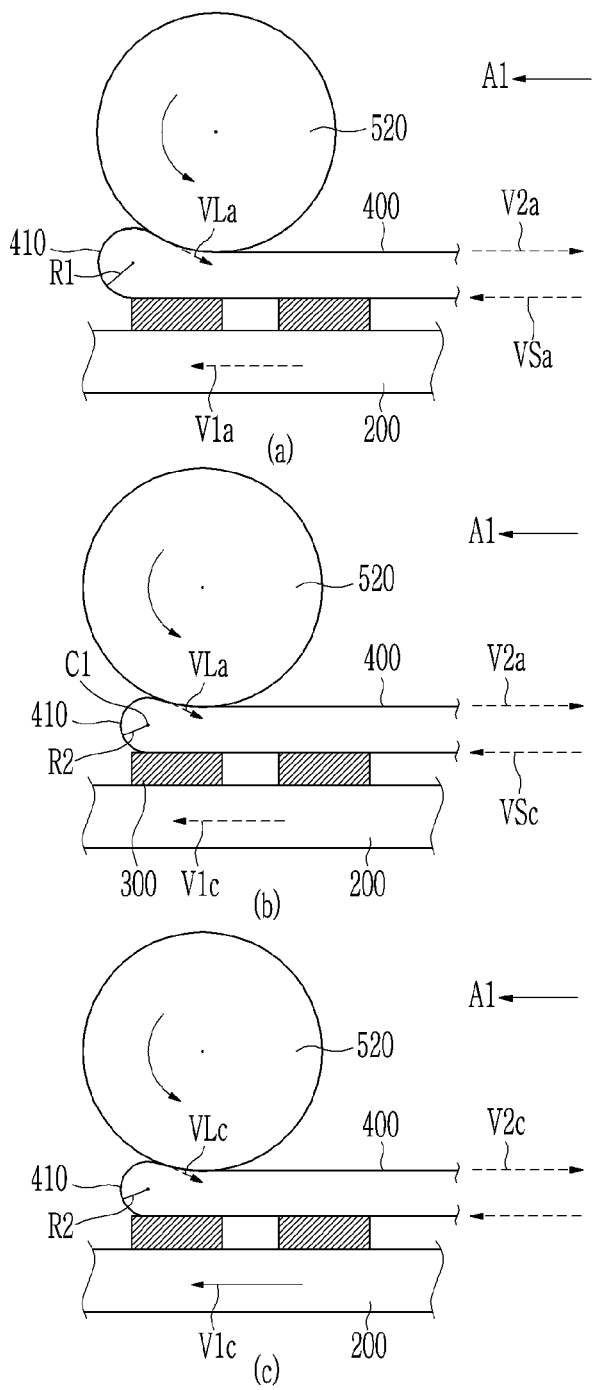

FIG. 5 is a flowchart illustrating controlling in the method of transferring the micro device according to the first exemplary embodiment of the present invention, and FIGS. 6 and 7 are diagrams illustrating an example for describing the controlling in the method of transferring the micro device according to the first exemplary embodiment of the present invention. Herein, FIG. 6 describes the case where the radius of curvature of the bent circular arc is adjusted by adjusting a linear velocity of the pressurizing roller, and FIG. 7 describes the case where the radius of curvature of the bent circular arc is adjusted by adjusting a feeding speed of the target substrate.

First, referring to FIGS. 5 and 6, the method of transferring the micro device may further include first controlling S150, in which the radius of curvature of the bent circular arc is adjusted by adjusting a linear velocity of the pressurizing roller, and the first controlling S150 may include first curvature radius adjusting S151 and first speed adjusting S152.

Herein, the first curvature radius adjusting S151 may be an operation, in which for a predetermined time, the radius of curvature of the bent circular arc is controlled to be decreased by shifting the location of the first center of the bent circular arc in the rear direction based on the first direction A1 by increasing a linear velocity of the pressurizing roller, or an operation, in which the radius of curvature of the bent circular arc is controlled to be increased by shifting the location of the first center of the bent circular arc in the front direction based on the first direction A1 by decreasing a linear velocity of the pressurizing roller.

That is, as illustrated in (a) of FIG. 6, in the state where the target substrate 200 is fed at a first feeding speed V1a, the pressurizing roller 520 rotates at a first linear velocity VLa, and the transferring film 400 is supplied at a first supply speed VSa and is collected at a first collection speed V2a, the bent circular arc 410 may have a first radius of curvature R1.

Further, as illustrated in (b) of FIG. 6, when the linear velocity of the pressurizing roller 520 is increased to a second linear velocity VLb that is larger than the first linear velocity VLa, a feeding speed of the upper transferring film 400b may be increased at a part that is in close contact with and pressurized to the pressurizing roller 520 by frictional force with the pressurizing roller 520. In the meantime, the feeding speed of the lower transferring film 400a maintains a first supply speed VSa, so that the location of the first center C1 of the bent circular arc 410 may be shifted in the rear direction based on the first direction A1 that is the feeding direction of the target substrate 200, and the bent circular arc 410 may have a second radius of curvature R2 that is smaller than the first radius of curvature R1.

Herein, the increase of the linear velocity of the pressurizing roller 520 to the second linear velocity VLb may be performed for a predetermined time. Further, during the time, a collection speed of the upper transferring film 400b maintains the first collection speed V2a, so that a curve S may be generated at a part of the upper transferring film 400b due to a difference with the part which is in close contact with the pressurizing roller 520 to have the increasing feeding speed.

The first speed adjusting S152 may be an operation of controlling the first speed and the second speed to be the same as the linear velocity of the pressurizing roller adjusted in the first curvature radius adjusting S151 after the first curvature radius adjusting S151.

That is, as illustrated in (c) of FIG. 6, the feeding speed of the target substrate 200 may be controlled to have the same size as that of the second linear velocity VLb of the pressurizing roller 520 by increasing the feeding speed of the target substrate 200 to the second feeding speed V1b that is larger than the first feeding speed V1a, and at the same time, the collection speed of the transferring film 400 may be controlled to have the same size as that of the second linear velocity VLb of the pressurizing roller 520 by increasing the collection speed of the transferring film 400 to the second collection speed V2b that is larger than the first collection speed V2a. Accordingly, the upper transferring film 400b may be collected while being tightly maintained with a curve, and the second radius of curvature R2 of the bent circular arc 410 may be uniformly maintained.

In the case where the radius of curvature of the bent circular arc 410 is controlled to be increased, the foregoing process may be inversely applied.

Next, referring to FIGS. 5 and 7, the method of transferring the micro device may further include second controlling S160, in which the radius of curvature of the bent circular arc is adjusted by adjusting a feeding speed of the target substrate, and the second controlling S160 may include second curvature radius adjusting S161 and second speed adjusting S162.

Herein, the second curvature radius adjusting S161 may be an operation, in which for a predetermined time, the radius of curvature of the bent circular arc is controlled to be increased by shifting the location of the first center of the bent circular arc in the front direction based on the first direction A1 by increasing the first speed of the target substrate, or an operation, in which the radius of curvature of the bent circular arc is controlled to be decreased by shifting the location of the first center of the bent circular arc in the rear direction based on the first direction A1 by decreasing the first speed of the target substrate for a predetermined time.

That is, as illustrated in (a) of FIG. 7, in the state where the target substrate 200 is fed at a first feeding speed V1a, the pressurizing roller 520 rotates at a first linear velocity VLa, and the transferring film 400 is supplied at a first supply speed VSa and is collected at a first collection speed V2a, the bent circular arc 410 may have a first radius of curvature R1.

Further, as illustrated in (b) of FIG. 7, when the feeding speed of the target substrate 200 is decreased to a third feeding speed V1c that is smaller than the first feeding speed V1a, the transferring film 400 to which the micro device 300 provisionally bonded to the target substrate 200 is bonded may also be supplied at a third supply speed VSc that is smaller than the first supply speed VSa. Accordingly, the first collection speed V2a of the transferring film 400 is larger than the third supply speed VSc, so that the location of the first center C1 of the bent circular arc 410 may be shifted in the rear direction based on the first direction A1 that is the feeding direction of the target substrate 200 while the transferring film 400 is relatively rapidly collected, and the bent circular arc 410 may have the second radius of curvature R2 that is smaller than the first radius of curvature R1. Herein, the decrease of the feeding speed of the target substrate 200 to the third feeding speed V1c may be performed for a predetermined time.

The second speed adjusting S162 may be an operation of controlling the linear velocity of the pressurizing roller and the second speed to be the same as the first speed of the target substrate adjusted in the second curvature radius adjusting S161 after the second curvature radius adjusting S161.

That is, as illustrated in (c) of FIG. 7, the linear velocity of the pressurizing roller 520 and the collection speed of the transferring film 400 may be controlled to have the same size as that of the third feeding speed V1c of the target substrate 200 by decreasing the linear velocity of the pressurizing roller 520 to the third linear velocity VLc that is smaller than the first linear velocity VLa and decreasing the collection speed of the transferring film 400 to the third collection speed V2c that is smaller than the first collection speed V2a, and thus, the second radius of curvature R2 of the bent circular arc 410 may be uniformly maintained.

In the case where the radius of curvature of the bent circular arc 410 is controlled to be increased, the foregoing process may be inversely applied.

The first controlling S150 or the second controlling S160 may be performed at a time requiring the adjustment of the radius of curvature of the bent circular arc, for example, an initial setting operation at which the micro device transferring process starts.

Figure 8:
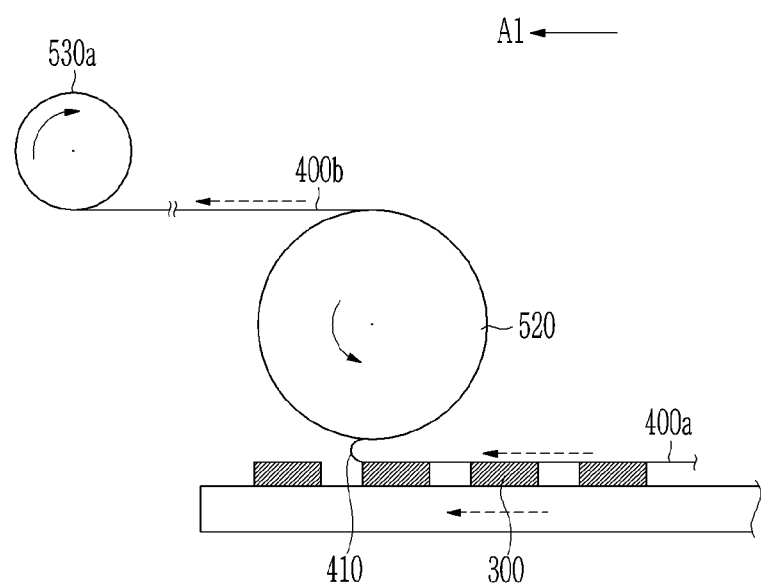
FIG. 8 is a diagram illustrating an example of a transferring process according to a method of transferring a micro device according to a second exemplary embodiment of the present invention.

FIG. 8 is a diagram illustrating an example of a transferring process according to a method of transferring a micro device according to a second exemplary embodiment of the present invention. In the present exemplary embodiment, a location of a collecting roller may be different, and other configurations are the same as those of the first exemplary embodiment, so that repeated contents will be omitted if possible.

As illustrated in FIG. 8, a collecting roller 530a may be provided at a front side of a first direction A1 that is a feeding direction of a target substrate 200 based on a pressurizing roller 520. A transferring film which is separated from a micro device 300 and is bent upwardly to form a bent circular arc 410 may be shifted so as to be in close contact with the pressurizing roller 520, shifted upwardly, and then collected. Accordingly, the supplied lower transferring film 400a and the collected upper transferring film 400b may be fed in the same direction, that is, the first direction A1.

Figure 9:
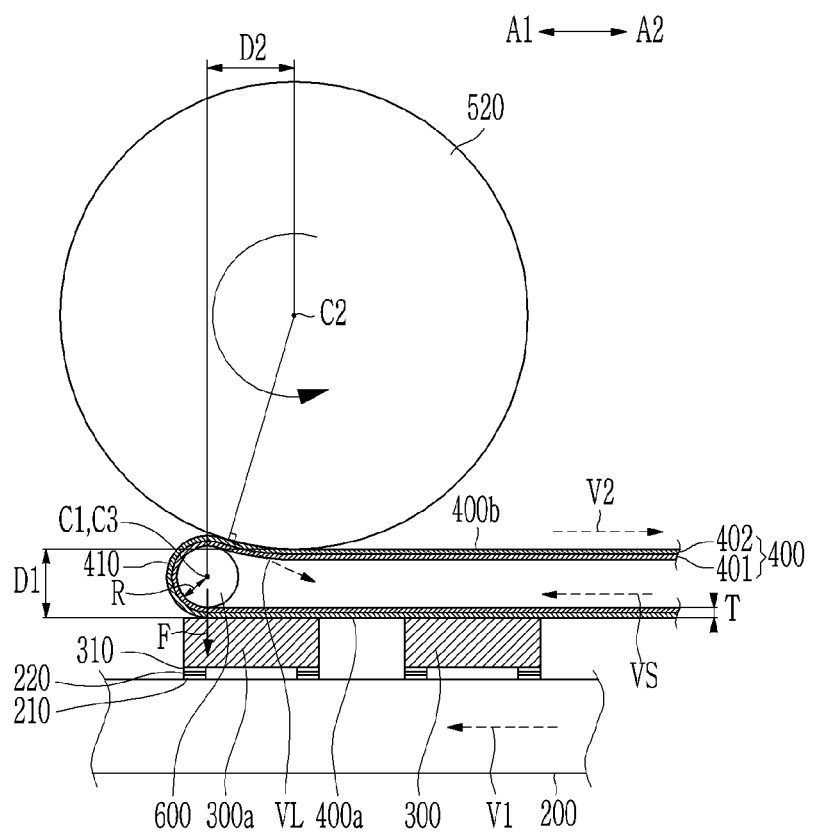
FIG. 9 is a diagram illustrating an example of an enlarged principal part of a transferring process according to a method of transferring a micro device according to a third exemplary embodiment of the present invention.

FIG. 9 is a diagram illustrating an example of an enlarged principal part of a transferring process according to a method of transferring a micro device according to a third exemplary embodiment of the present invention. In the present exemplary embodiment, a pressurizing rod 600 may be further included, and other configurations are the same as those of the first exemplary embodiment, so that repeated contents will be omitted if possible.

As illustrated in FIG. 9, the pressurizing rod 600 may be prepared at an internal side of a bent circular arc 410 formed by a transferring film 400. Herein, the internal side of the bent circular arc 410 means a space in a direction in which a first center C1 is located. According to the exemplary embodiment, the pressurizing rod 600 may have a circular cross-section and be formed of a flexible material. Accordingly, when an upper transferring film 400b is pressurized by a pressurizing roller 520, additional pressure F by the pressuring rod 600 may be delivered better while pressure is delivered to a lower transferring film 400a in a lower direction. In order to efficiently deliver the additional pressure F, the pressurizing rod 600 may be disposed so as to be in contact with an internal surface of the bent circular arc 410 and may be coaxially disposed with the first center C1 of the bent circular arc 410. In the present exemplary embodiment, when pressure enough to transfer a micro device 300a to a target substrate 200 is not generated only with rigidity of the transferring film 400, it is possible to provide sufficient pressure required for the transference by adding the additional pressure by the pressurizing rod 600.

Figure 10:
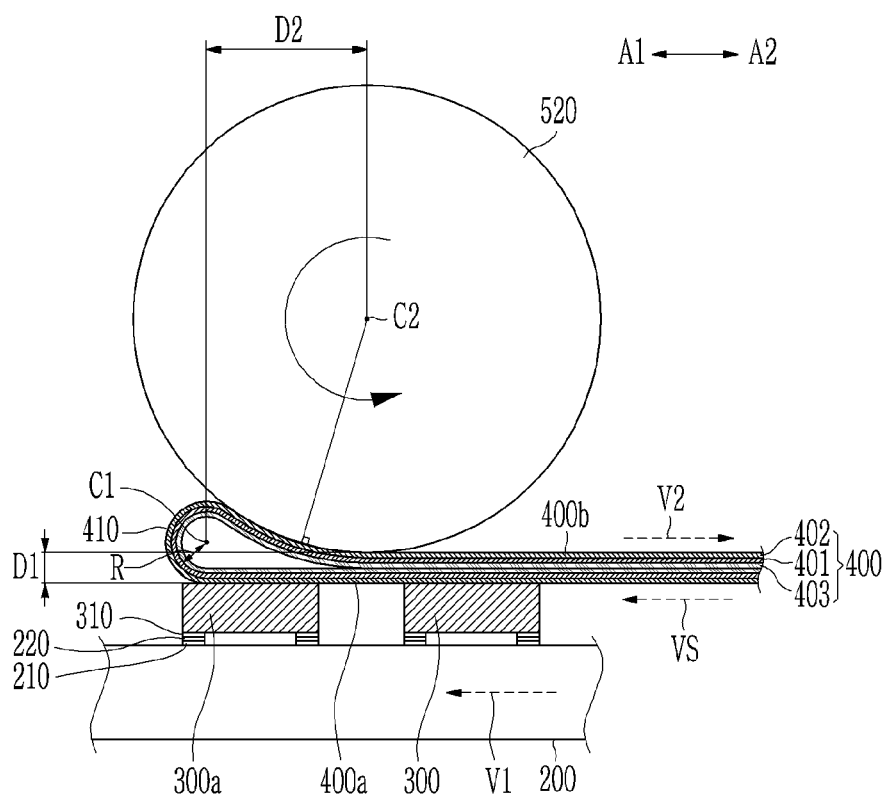
FIG. 10 is a diagram illustrating an example of an enlarged principal part of a transferring process according to a method of transferring a micro device according to a fourth exemplary embodiment of the present invention.

FIG. 10 is a diagram illustrating an example of an enlarged principal part of a transferring process according to a method of transferring a micro device according to a fourth exemplary embodiment of the present invention.

As illustrated in FIG. 10, a lower transferring film 400a before a bent circular arc 410 is formed may be in contact with an upper transferring film 400b after the bent circular arc 410 is formed. That is, according to the present exemplary embodiment, pressurizing force by a pressurizing roller 520 may be directly delivered to the lower transferring film 400a, as well as the upper transferring film 400b.

In this case, in order for the upper transferring film 400b and the lower transferring film 400a which are in contact with each other to be smoothly fed, a transferring film 400 may further include a lubricating layer 403. The lubricating layer 403 may be provided at a side opposite to an adhesive layer 402 based on a base layer 401, and may be formed of a material having a very small friction coefficient. In the present exemplary embodiment, when pressure enough to transfer a micro device 300a to a target substrate 200 is not generated only with rigidity of the transferring film 400, it is possible to provide sufficient pressure required for the transference by directly applying applied pressure by the pressurizing roller 520 to the micro device 300a. In the meantime, although not illustrated in FIG. 10, in the present exemplary embodiment, the pressurizing rod 600 of the third exemplary embodiment may be additionally provided.

The description of the present invention is for illustrative, and it will be understood by those skilled in the art that various changes in a specific form and details may be made therein without the change of the technical spirit or the essential features of the present invention. Accordingly, it shall be understood that the exemplary embodiments described above are illustrative in all aspects, and are not limited. For example, each constituent element described in a singular form may be distributed and fed, and similarly, constituent elements described as being distributed may be fed in a combined form.

The scope of the present invention is represented by the claims, and it shall be construed that all of the changes or modified forms derived from the meaning and the scope of the claim and an equivalent concept thereof are included in the scope of the present invention.

DESCRIPTION OF SYMBOLS

| | |
|---|---|
| 200: Target substrate | 300, 300a: Micro device |
| 400: Transferring film | 400a: Lower transferring film |
| 400b: Upper transferring film | 410: Bent circular arc |
| 520: Pressurizing roller | 530, 530a: Collecting roller |
| 600: Pressurizing rod | V1: First speed |
| V2: Second speed | VL: Linear velocity |
| VS: Supply speed | |

The invention claimed is:

1. A method of transferring a micro device, the method comprising:
feeding a target substrate in a first direction at a first speed;
supplying a transferring film bonded with a micro device in the first direction, the micro device facing an upper portion of the target substrate;
pressurizing the transferring film, the pressurizing including bending the transferring film separated from the micro device upwardly to form a bent circular arc, and pressurizing an upper transferring film fed after forming the bent circular arc with a pressurizing roller rotating at an upper side of the target substrate to deliver pressure to a lower transferring film bonded with the micro device; and
collecting the upper transferring film by feeding the upper transferring film fed after forming the bent circular arc at a second speed along a second direction opposite to the first direction,
wherein a first center of the bent circular arc is in a front side of a second center of the pressurizing roller based on the first direction.

2. The method of claim 1, wherein:
a linear velocity of the pressurizing roller, the second speed, and the first speed are the same.

3. The method of claim 1, further comprising:
first controlling for adjusting a radius of curvature of the bent circular arc by adjusting a linear velocity of the pressurizing roller for a predetermined time.

4. The method of claim 3, wherein:
the first controlling includes first curvature radius adjusting in which a radius of curvature of the bent circular arc is controlled to be decreased by shifting a location of the first center of the bent circular arc to a rear side based on the first direction by increasing the linear velocity of the pressurizing roller, or a radius of curvature of the bent circular arc is controlled to be increased by shifting a location of the first center of the bent circular arc to a front side based on the first direction by decreasing the linear velocity of the pressurizing roller.

5. The method of claim 4, wherein:
the first controlling further includes first speed adjusting in which the first speed and the second speed are controlled to be the same as the linear velocity of the pressurizing roller adjusted in the first curvature radius adjusting after the first curvature radius adjusting.

6. The method of claim 1, further comprising:
second controlling for adjusting a radius of curvature of the bent circular arc by adjusting the first speed of the target substrate for a predetermined time.

7. The method of claim 6, wherein:
the second controlling includes second curvature radius adjusting in which the radius of curvature of the bent circular arc is controlled to be increased by shifting a location of the first center of the bent circular arc to a front side based on the first direction by increasing the first speed of the target substrate, or the radius of curvature of the bent circular arc is controlled to be decreased by shifting a location of the first center of the bent circular arc to a rear side based on the first direction by decreasing the first speed of the target substrate.

8. The method of claim 7, wherein:
the second controlling further includes second speed adjusting in which the linear velocity of the pressurizing roller and the second speed are controlled to be equal to the first speed of the target substrate adjusted in the second curvature radius adjusting after the second curvature radius adjusting.

9. The method of claim 1, wherein:
the pressurizing the upper transferring film includes delivering additional pressure to the lower transferring film through a pressurizing rod disposed inside the bent circular arc formed by the transferring film.

10. The method of claim 1, wherein:
in the pressurizing the upper transferring film, when the pressurizing roller pressurizes the upper transferring film, the upper transferring film is in contact with the lower transferring film.

11. An apparatus for transferring a micro device, the apparatus comprising:
a supplying roller configured to supply a transferring film bonded with a micro device in a first direction;
a target substrate, to which the micro device is transferred from the supplied transferring film, while being fed in the first direction;
a pressurizing roller disposed in an upper portion of the target substrate and configured to pressurize the transferring film from which the micro device is separated; and
a collecting roller configured to collect the transferring film,
wherein the transferring film which transfers the micro device to the target substrate is shifted in a second direction opposite to the first direction while being bent upwardly and forming a bent circular arc, and
a center of the pressurizing roller is arranged at a rear side of a center of the bent circular arc, and the pressurizing roller pressurizes the transferring film shifted in the second direction in a lower direction while forming the bent circular arc.

12. The apparatus of claim 11, further comprising:
a pressurizing rod disposed inside the bent circular arc formed by the transferring film.

13. The apparatus of claim 11, wherein:
the transferring film includes:
a base layer having rigidity; and
an adhesive layer provided on one surface of the base layer to provide adhesive force to the micro device, and wherein the adhesive layer from which the micro device is separated is in contact with the pressurizing roller to provide frictional force.

14. The apparatus of claim 11, wherein:

the transferring film further includes a lubricating layer provided on the other surface of the base layer so that the transferring films before and after the bent circular arc is formed are in contact with each other and are shifted.

* * * * *